(12) United States Patent
Fujikami et al.

(10) Patent No.: US 7,596,852 B2
(45) Date of Patent: Oct. 6, 2009

(54) METHOD OF MANUFACTURING SUPERCONDUCTING WIRE

(75) Inventors: Jun Fujikami, Osaka (JP); Takeshi Kato, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 443 days.

(21) Appl. No.: 10/568,537

(22) PCT Filed: Feb. 17, 2005

(86) PCT No.: PCT/JP2005/002410

§ 371 (c)(1),
(2), (4) Date: Feb. 17, 2006

(87) PCT Pub. No.: WO2005/112047

PCT Pub. Date: Nov. 24, 2005

(65) Prior Publication Data

US 2007/0271768 A1    Nov. 29, 2007

(30) Foreign Application Priority Data

May 13, 2004 (JP) ............................. 2004-143670

(51) Int. Cl.
 *H01L 39/24* (2006.01)
(52) U.S. Cl. .......................... 29/599; 505/430
(58) Field of Classification Search .................. 29/599, 29/825, 412, 417; 174/125.1, 15.5; 505/230, 505/430–432, 884
See application file for complete search history.

(56) References Cited

U.S. PATENT DOCUMENTS

| | | | | |
|---|---|---|---|---|
| 3,218,693 A | * | 11/1965 | Stauffer et al. | 148/98 |
| 4,906,609 A | * | 3/1990 | Yamauchi et al. | 505/433 |
| 5,034,857 A | * | 7/1991 | Wong | 361/509 |
| 5,554,448 A | * | 9/1996 | Yamada et al. | 428/612 |
| 5,869,196 A | * | 2/1999 | Wong et al. | 428/613 |
| 6,103,669 A | * | 8/2000 | Okayama et al. | 505/430 |
| 6,493,925 B1 | | 12/2002 | Kaneko et al. | |
| 6,543,123 B1 | * | 4/2003 | Wong | 29/599 |
| 7,146,709 B2 | * | 12/2006 | Wong | 29/599 |

FOREIGN PATENT DOCUMENTS

| | | |
|---|---|---|
| EP | 0 609 804 | 10/1999 |
| RU | 2101792 | 1/1998 |
| RU | 2105370 | 2/1998 |
| RU | 2122758 | 11/1998 |
| RU | 2157012 | 9/2000 |

* cited by examiner

*Primary Examiner*—Minh Trinh
(74) *Attorney, Agent, or Firm*—Foley & Lardner LLP

(57) ABSTRACT

A method of manufacturing a superconducting wire includes the step of drawing a wire formed by coating raw material powder for a superconductor with a metal, the step of first rolling rolling a multifilamentary wire after the step of drawing, and the step of first sintering sintering the multifilamentary wire after the step of the first rolling. The method further includes the step of holding a clad wire, a multifilamentary wire, or a multifilamentary wire under a reduced-pressure atmosphere in at least one of an interval between the step of drawing and the step of the first rolling and an interval between the step of the first rolling and the step of the first sintering.

9 Claims, 5 Drawing Sheets

METHOD OF MANUFACTURING SUPERCONDUCTING WIRE

TECHNICAL FIELD

The present invention relates to a method of manufacturing a superconducting wire, and in particular, to a method of manufacturing a superconducting wire capable of obtaining a superconducting wire with high and uniform performance.

BACKGROUND ART

A superconducting wire made of a multifilamentary wire formed by coating an oxide superconductor having for example Bi2223 phase with a metal is conventionally expected to be applied to a superconducting cable and a magnet, since it can be used at a temperature cooled by liquid nitrogen and a relatively high critical current density can be obtained, and it can be prolonged relatively easily.

Such a superconducting wire has been manufactured as will be described below. Firstly, a wire is fabricated to have a form in which raw material powder for a superconductor containing such as Bi2223 phase is coated with a metal. Next, by performing thermal treatment and rolling repeatedly, a superconducting phase is generated as aligned to a superconducting filament part of the wire, and thus a tape-like superconducting wire is obtained. Such a method of manufacturing a superconducting wire is disclosed for example in Japanese Patent No. 2636049 (Japanese Patent Laying-Open No. 03-138820) (Patent Document 1) and Japanese Patent No. 2855869 (Japanese Patent Laying-Open No. 04-292812) (Patent Document 2).

Patent Document 1: Japanese Patent No. 2636049 (Japanese Patent Laying-Open No. 03-138820)
Patent Document 2: Japanese Patent No. 2855869 (Japanese Patent Laying-Open No. 04-292812)

DISCLOSURE OF THE INVENTION

Problems to be Solved by the Invention

Conventionally, an optimum manufacturing condition for each manufacturing step has been sought to improve performance (such as a critical current value) of a superconducting wire. However, even when a superconducting wire is manufactured under the same optimum condition, the obtained superconducting wire has variations in each performance. Further, some of the obtained superconducting wire has poor performance, and thus a high performance superconducting wire cannot be obtained.

Therefore, an object of the present invention is to provide a method of manufacturing a superconducting wire capable of obtaining a superconducting wire with high and uniform performance.

Means to Solve the Problems

A method of manufacturing a superconducting wire in an aspect of the present invention includes the steps of drawing a wire formed by coating raw material powder for a superconductor with a metal, rolling the wire after the step of drawing, and sintering the wire after the step of rolling. The method further includes the step of holding the wire under a reduced-pressure atmosphere in at least one of an interval between the step of drawing and the step of rolling and an interval between the step of rolling and the step of sintering.

After careful examination, inventors of the present invention have found that the obtained superconducting wire has variations in each performance due to reasons which will be described below. In each of the intervals between the steps of drawing, rolling, and sintering, $CO_2$ (carbon dioxide), $H_2O$ (water), $O_2$ (oxygen) and the like in the air intrude into the wire through both end portions of the wire or the metal coating the superconductor. This leads to generation of a hetero phase other than the superconducting phase during sintering, or an uneven thickness of the wire. The generation of a hetero phase during sintering interferes with the generation of the superconducting phase, and deteriorates superconducting properties such as the critical current value. Further, if the wire has an uneven thickness, pressure is not uniformly applied to the wire when rolling is performed later, and thus the obtained superconducting wire has an uneven thickness. As a result, the performance of the superconducting wire is deteriorated. Conventionally, the condition of holding the wire between the step of drawing and the step of rolling, or between the step of rolling and the step of sintering has not particularly been specified. Accordingly, the obtained superconducting wire has variations in each performance depending on the difference in the holding condition.

Consequently, by holding the wire under a reduced-pressure atmosphere in at least one of the intervals between the steps of drawing, rolling, and sintering, the intrusion of $CO_2$, $H_2O$, and $O_2$ in the air into the raw material powder can be suppressed. Further, by holding the wire under a reduced-pressure atmosphere, residues such as $CO_2$, $H_2O$, $O_2$ and the like contained within the wire are discharged through the both end portions of the wire or the metal coating the superconductor. As a result, a hetero phase is less likely to be generated during sintering and the wire has a uniform thickness, and thus a superconducting wire having high and uniform performance can be obtained.

A method of manufacturing a superconducting wire in another aspect of the present invention includes the steps of drawing a wire formed by coating raw material powder for a superconductor with a metal, rolling the wire n times (n is an integer not less than 2), and sintering the wire n times. The step of first rolling in the step of rolling the wire n times is performed after the step of drawing. The step of first sintering in the step of sintering the wire n times is performed after the step of the first rolling. The step of k-th (k is an integer satisfying n ≧k ≧2) rolling in the step of rolling the wire n times is performed after the step of (k−1)-th sintering in the step of sintering the wire n times. The step of k-th sintering in the step of sintering the wire n times is performed after the step of the k-th rolling in the step of rolling the wire n times. The method further includes the step of holding the wire under a reduced-pressure atmosphere in at least one of an interval between the step of drawing and the step of the first rolling, an interval between the step of the first rolling and the step of the first sintering, an interval between the step of the (k−1)-th sintering and the step of the k-th rolling, and an interval between the step of the k-th rolling and the step of the k-th sintering.

After careful examination, the inventors of the present invention have found that the obtained superconducting wire has variations in each performance due to reasons which will be described below. When the step of rolling the wire n times and the step of sintering the wire n times are performed to manufacture a superconducting wire, $CO_2$ (carbon dioxide), $H_2O$ (water), $O_2$ (oxygen) and the like in the air intrude into the raw material powder through both end portions of the wire or the metal coating the superconductor, in an interval between the step of drawing and the step of first rolling, an interval between the step of the first rolling and the step of first sintering, an interval between the step of (k−1)-th sintering and the step of k-th rolling, and an interval between the step of the k-th rolling and the step of k-th sintering. As a result, the performance of the superconducting wire is deteriorated as described above. Conventionally, when the step of rolling the wire n times and the step of sintering the wire n times are performed, the condition of holding the wire has not particularly been specified in the interval between the step of drawing and the step of the first rolling, the interval between the step of the first rolling and the step of the first sintering, the interval between the step of the (k−1)-th sintering and the step of the k-th rolling, and the interval between the step of the k-th rolling and the step of the k-th sintering. Accordingly, the obtained superconducting wire has variations in each performance depending on the difference in the holding condition.

Consequently, by holding the wire under a reduced-pressure atmosphere in at least one of the interval between the step of drawing and the step of the first rolling, the interval between the step of the first rolling and the step of the first sintering, the interval between the step of the (k−1)-th sintering and the step of the k-th rolling, and the interval between the step of the k-th rolling and the step of the k-th sintering, the intrusion of $CO_2$, $H_2O$, and $O_2$ in the air into the raw material powder can be suppressed. Further, by holding the wire under a reduced-pressure atmosphere, residues such as $CO_2$, $H_2O$, $O_2$ and the like contained within the wire are discharged through the both end portions of the wire or the metal coating the superconductor. As a result, a hetero phase is less likely to be generated during sintering and the wire has a uniform thickness, and thus a superconducting wire having high and uniform performance can be obtained.

Preferably, in the method of manufacturing a superconducting wire in another aspect of the present invention, the step of holding is performed in the interval between the step of the first rolling and the step of the first sintering.

The inventors of the present invention have found that $CO_2$, $H_2O$, and $O_2$ in the air are more likely to intrude into the raw material powder in the interval between the step of the first rolling and the step of the first sintering. Therefore, a superconducting wire having higher and more uniform performance can be obtained.

Preferably, in the method of manufacturing a superconducting wire of the present invention, the reduced-pressure atmosphere has a pressure of not more than 0.01 MPa. Thereby, the intrusion of $CO_2$, $H_2O$, and $O_2$ in the air into the superconductor can further be suppressed.

Preferably, in the method of manufacturing a superconducting wire of the present invention, the step of holding is performed for not less than 72 hours. Thereby, residues contained within the wire can be discharged sufficiently.

Preferably, in the method of manufacturing a superconducting wire of the present invention, the wire is held at a temperature of not less than 80° C. in the step of holding. This facilitates evaporation of the residues contained within the wire, and thus a superconducting wire having high and uniform performance can be obtained.

Preferably, in the method of manufacturing a superconducting wire of the present invention, the step of holding is performed in an atmosphere of nitrogen gas, argon gas, or dry air.

This can prevent impurities such as $CO_2$, $H_2O$, $O_2$ and the like from intruding into the raw material powder during the step of holding.

It is to be noted that rolling and sintering in the present invention may be performed only once, respectively, or may be performed a plurality of times (n times), respectively. Further, in the specification, the "first rolling" refers to the step of rolling the wire for the first time, and the "first sintering" refers to the step of sintering the wire for the first time.

When the step of drawing is performed on the wire a plurality of times, the "step of drawing" refers to the first drawing performed on the wire. Furthermore, "dry air" refers to air having a dew point at atmospheric pressure of not more than −20° C.

Effects of the Invention

According to the method of manufacturing a superconducting wire of the present invention, the intrusion of $CO_2$, $H_2O$, and $O_2$ in the air into the wire can be suppressed in each of the intervals between the steps of drawing, the first rolling, and the first sintering. Further, by holding the wire under a reduced-pressure atmosphere, residues such as $CO_2$, $H_2O$, $O_2$ and the like contained within the wire are discharged through the both end portions of the wire or the metal coating the superconductor. As a result, a hetero phase is less likely to be generated during sintering and the wire has a uniform thickness, and thus a superconducting wire having high and uniform performance can be obtained.

Figure 1:
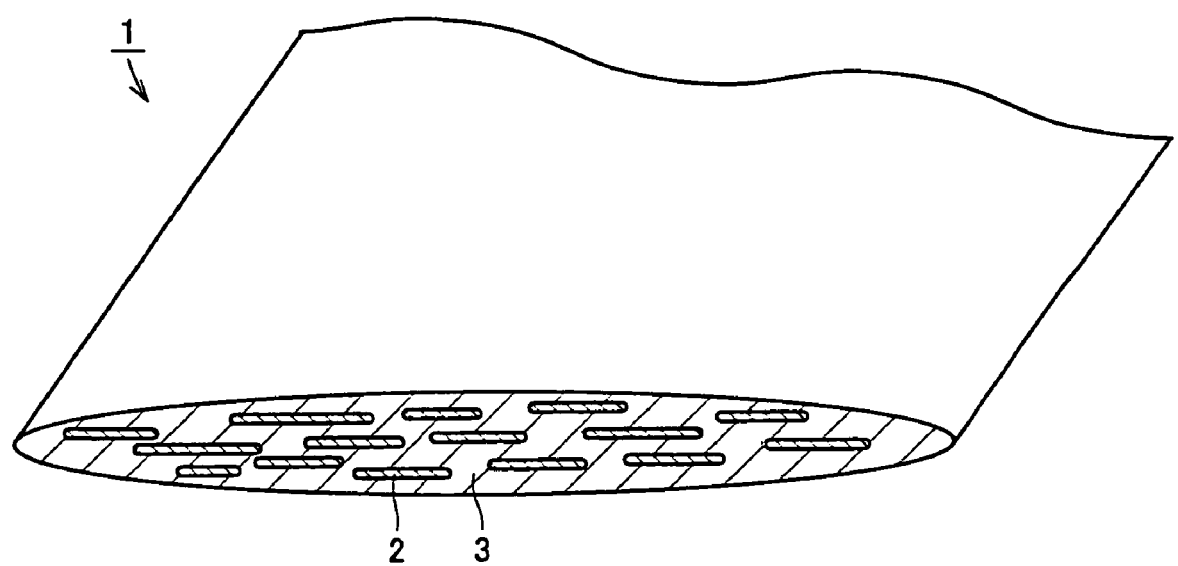
FIG. 1 is a fragmentary sectional perspective view illustrating a structure of a superconducting wire on a conceptual basis.

DESCRIPTION OF REFERENCE CHARACTERS 1. superconducting wire (multifilamentary wire), 1a. wire, 1b. clad wire, 1c. multifilamentary wire, 2. superconductor filament, 2a. raw material powder, 3. sheath part, 3a, 3b. pipe, 20. casing, 21. exhaust duct, 22. holder, 23. heater.

BEST MODES FOR CARRYING OUT THE INVENTION

In the following, an embodiment of the present invention will be described with reference to the drawings.

FIG. 1 is a fragmentary sectional perspective view illustrating a structure of a superconducting wire on a conceptual basis. Referring to FIG. 1, explanation will be given on for example a multifilamentary superconducting wire. A superconducting wire 1 has a plurality of superconductor filaments 2 extending in a longitudinal direction and a sheath part 3 coating them. Each of the plurality of superconductor filaments 2 is made of a material having composition of for example the Bi—Pb—Sr—Ca—Cu—O system, and in particular, the optimum material is a material containing Bi2223 phase in which an atomic ratio of (bismuth and lead):strontium:calcium:copper is approximately represented by 2:2:2:3. Sheath part 3 is made of a material such as silver.

It is to be noted that, although explanation has been given on a multifilamentary wire, an oxide superconducting wire having a monofilamentary structure, in which a single superconductor filament 2 is coated with sheath part 3, may be used.

Next, a method of manufacturing the oxide superconducting wire described above will be explained.

Figure 2:
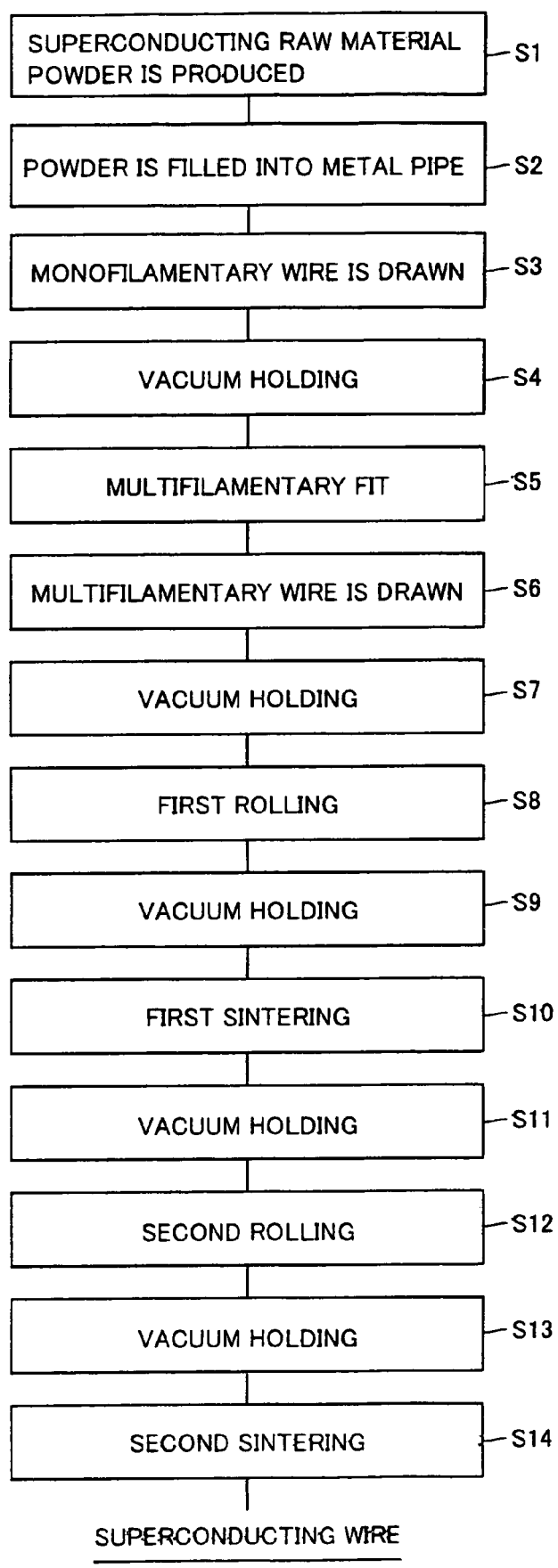
FIG. 2 is a flow chart illustrating a method of manufacturing a superconducting wire in an embodiment of the present invention.

FIG. 2 is a flow chart illustrating a method of manufacturing a superconducting wire in an embodiment of the present invention. FIGS. 3 to 8 illustrate respective steps in FIG. 2.

Referring to FIG. 2, the Powder-In-Tube method is used to manufacture a superconducting wire with for example the Bi2223 phase. Firstly, for example five kinds of raw material powder ($Bi_2O_3$, PbO, $SrCO_3$, $CaCO_3$, CuO) are mixed to produce raw material powder in an intermediate state (precursor powder) which will ultimately be changed to a superconductor with the Bi2223 phase by a reaction caused by thermal treatment (Step S1).

Figure 3:
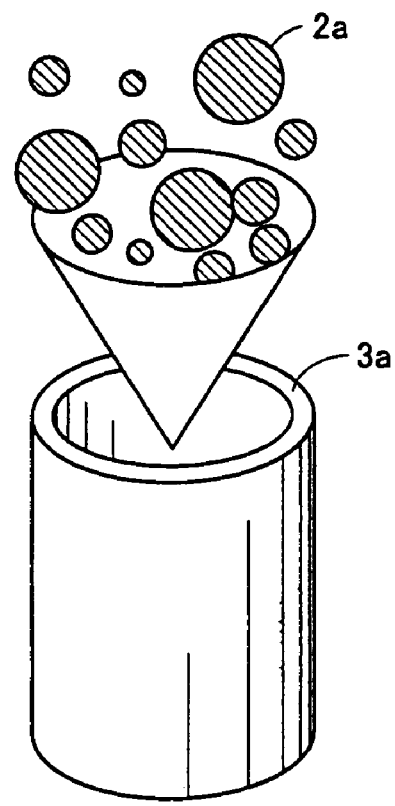
FIG. 3 is a first view illustrating a step in FIG. 2.

Next, as shown in FIGS. 2 and 3, this raw material powder 2a is filled into a pipe 3a (Step S2). Pipe 3a is made of a metal such as silver, having an outer diameter of φ20 to 40 mm and a wall thickness of about 3 to 15% of the outer diameter. Thereby, a wire 1a in which raw material powder 2a for the superconductor is coated with pipe 3a is obtained. Thereafter, degassing of the content of pipe 3a is performed, and both ends of pipe 3a are sealed.

Figure 4:
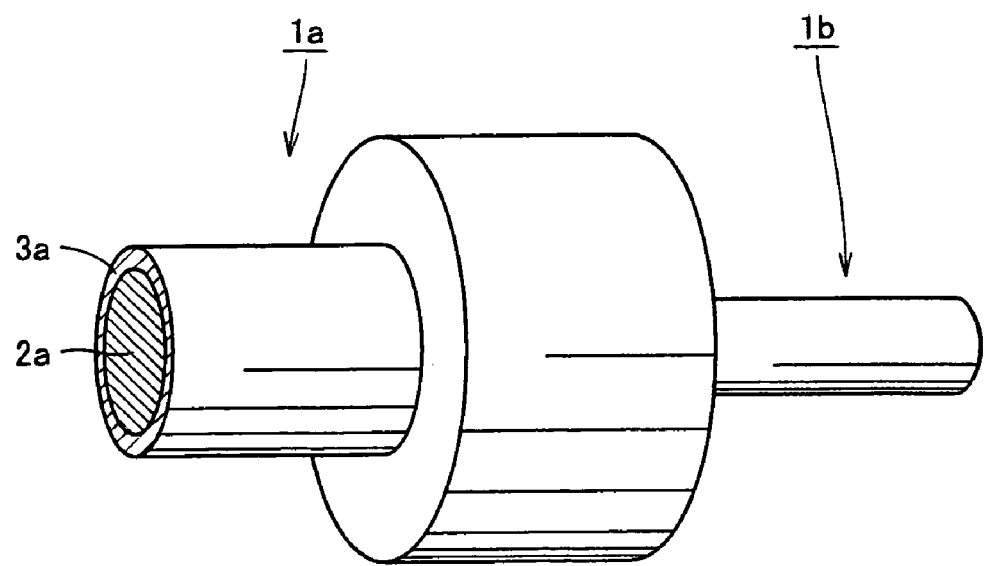
FIG. 4 is a second view illustrating a step in FIG. 2.

Next, as shown in FIGS. 2 and 4, wire 1a is drawn to form a clad wire 1b in which the precursor as a filamentary material is coated with a metal such as silver (Step S3). Clad wire 1b has a shape of a hexagon with a length between opposite sides of such as 2 to 10 mm.

Figure 5:
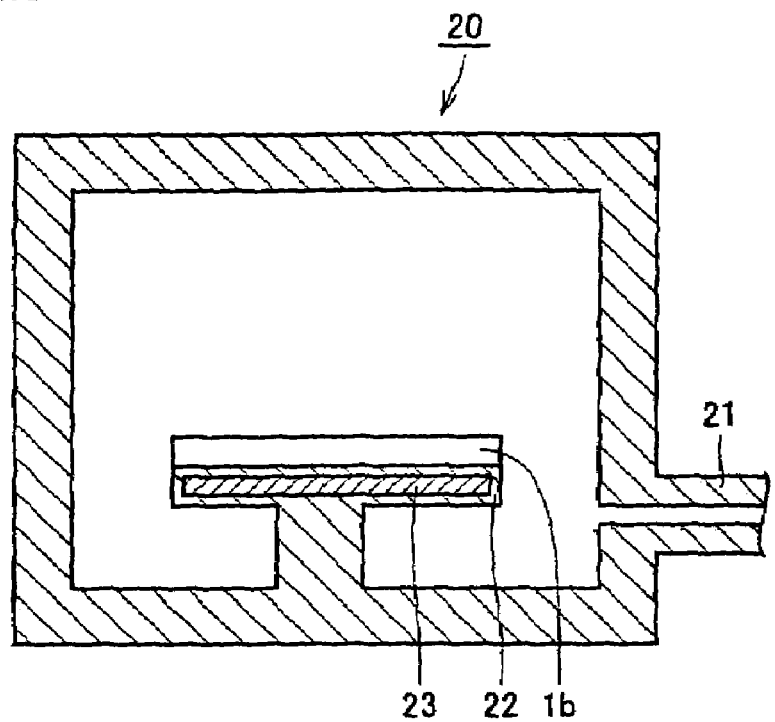
FIG. 5 is a third view illustrating a step in FIG. 2.

Next, as shown in FIGS. 2 and 5, clad wire 1b is held on a holder 22 within a casing 20 for example for not less than 72 hours (Step S4). Casing 20 has an exhaust duct 21, and exhaust duct 21 is connected for example to a vacuum pump (not shown). Air inside casing 20 is exhausted by the vacuum pump through exhaust duct 21, and thus the inside of casing 20 is in an atmosphere of a reduced pressure of for example not more than 0.01 MPa. Further, the inside of casing 20 is for example in an atmosphere of nitrogen gas, argon gas, or dry air. Furthermore, a heater 23 is provided within holder 22 to heat clad wire 1b held on holder 22 to a temperature of for example not less than 80° C. Since clad wire 1b is held under the reduced-pressure atmosphere, intrusion of $CO_2$, $H_2O$, $O_2$ and the like in the air into raw material powder 2a can be suppressed. Further, $CO_2$, $H_2O$, $O_2$ and the like within clad wire 1b can be discharged.

Figure 6:
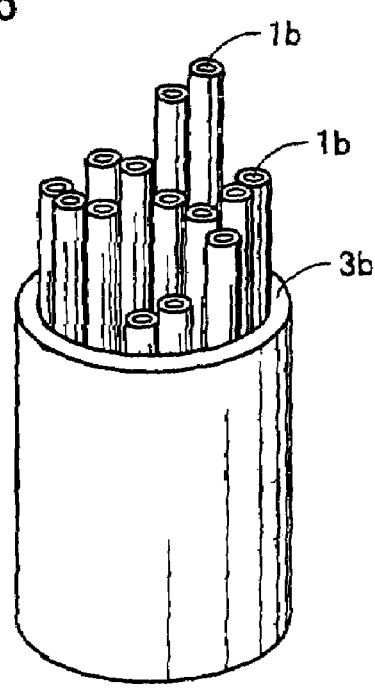
FIG. 6 is a fourth view illustrating a step in FIG. 2.

Next, as shown in FIGS. 2 and 6, a plurality of clad wires 1b are bundled to be fit into a pipe 3b made of a metal such as silver (multifilamentary fit: Step S5). This pipe 3b is made of a metal such as silver or an alloy thereof, having an outer diameter of φ10 to 50 mm and a wall thickness of about 1 to 15% of the outer diameter. Thereby, a wire with a multifilamentary structure having a plurality of filaments made of raw material powder 2a is obtained.

Figure 7:
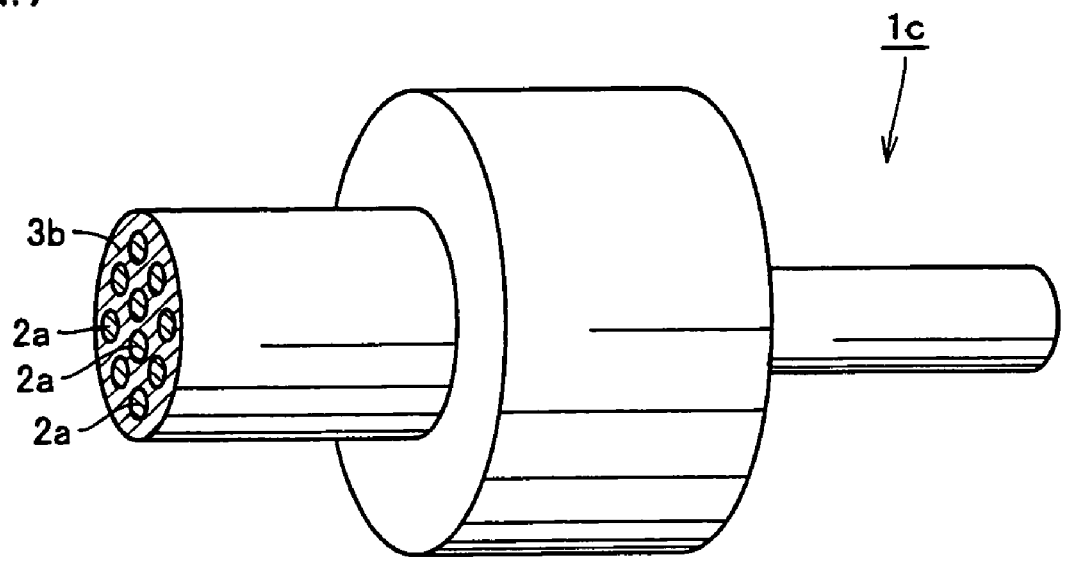
FIG. 7 is a fifth view illustrating a step in FIG. 2.

Next, as shown in FIGS. 2 and 7, the wire with the multifilamentary structure in which a plurality of filaments made of raw material powder 2a are coated with sheath part 3 is drawn to form a multifilamentary wire 1c in which raw material powder 2a is embedded within sheath part 3 made of such as silver (Step S6).

Next, as shown in FIGS. 2 and 5, multifilamentary wire 1c is held on holder 22 within casing 20 under the reduced-pressure atmosphere, for example for not less than 72 hours (Step S7). The inside of casing 20 is for example in an atmosphere of nitrogen gas, argon gas, or dry air. Since multifilamentary wire 1c is held under the reduced-pressure atmosphere, intrusion of $CO_2$, $H_2O$, $O_2$ and the like in the air into raw material powder 2a can be suppressed. Further, $CO_2$, $H_2O$, $O_2$ and the like within multifilamentary wire 1c can be discharged.

Figure 8:
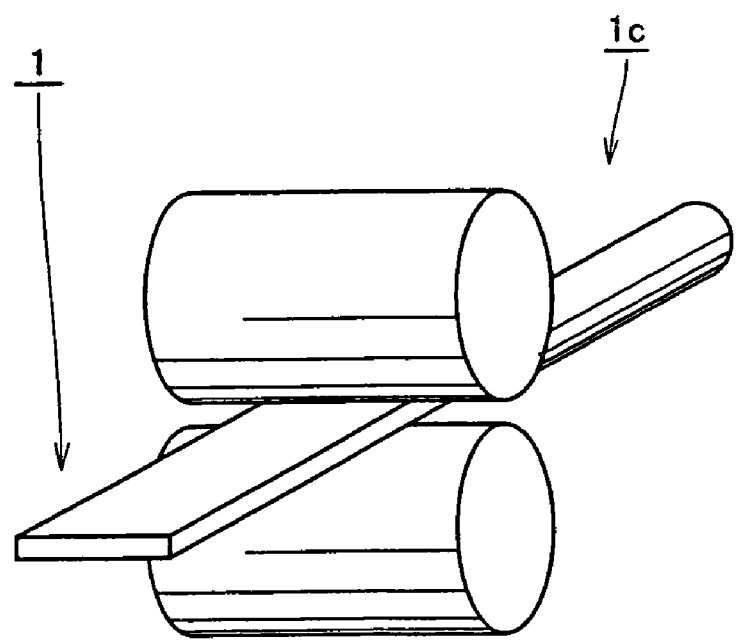
FIG. 8 is a sixth view illustrating a step in FIG. 2.

Next, as shown in FIGS. 2 and 8, first rolling is performed on multifilamentary wire 1c to obtain tape-like multifilamentary wire 1 (Step S8). The first rolling is performed at a draft of for example 70 to 90%.

Next, as shown in FIGS. 2 and 5, multifilamentary wire 1 is held on holder 22 within casing 20 under the reduced-pressure atmosphere, for example for not less than 72 hours (Step S9). The inside of casing 20 is for example in an atmosphere of nitrogen gas, argon gas, or dry air. Since multifilamentary wire 1 is held under the reduced-pressure atmosphere, intrusion of $CO_2$, $H_2O$, $O_2$ and the like in the air into raw material powder 2a can be suppressed. Further, $CO_2$, $H_2O$, $O_2$ and the like within multifilamentary wire 1 can be discharged.

Next, tape-like multifilamentary wire 1 is heated to a temperature of for example 830 to 850° C. and held at that temperature for 50 to 150 hours, and thus multifilamentary wire 1 is subjected to first sintering (Step S10). Thereby, raw material powder 2a chemically reacts to become superconductor filament 2.

Next, as shown in FIGS. 2 and 5, multifilamentary wire 1 is held on holder 22 within casing 20 under the reduced-pressure atmosphere, for example for not less than 72 hours (Step S11). The inside of casing 20 is for example in an atmosphere of nitrogen gas, argon gas, or dry air. Since multifilamentary wire 1 is held under the reduced-pressure atmosphere, intrusion of $CO_2$, $H_2O$, $O_2$ and the like in the air into superconductor filament 2 can be suppressed. Further, $CO_2$, $H_2O$, $O_2$ and the like within multifilamentary wire 1 can be discharged.

Next, as shown in FIGS. 2 and 8, multifilamentary wire 1 is subjected to second rolling (Step S12). The second rolling is performed at a draft of for example 0 to 20%.

Next, as shown in FIGS. 2 and 5, multifilamentary wire 1 is held on holder 22 within casing 20 under the reduced-pressure atmosphere, for example for not less than 72 hours (Step S13). The inside of casing 20 is for example in an atmosphere of nitrogen gas, argon gas, or dry air. Since multifilamentary wire 1 is held under the reduced-pressure atmosphere, intrusion of $CO_2$, $H_2O$, $O_2$ and the like in the air into superconductor filament 2 can be suppressed. Further, $CO_2$, $H_2O$, $O_2$ and the like within multifilamentary wire 1 can be discharged.

Next, multifilamentary wire 1 is heated to a temperature of 800 to 850° C. under a pressurized atmosphere and held at that temperature for 10 to 150 hours, and thus multifilamentary wire 1 is subjected to second sintering (Step S14). It is to be noted that the second sintering may be performed at atmospheric pressure instead of under a pressurized atmosphere. Although the superconducting wire of the present embodiment is obtained as described above, further rolling and sintering may be performed after the second sintering, and the second rolling and the second sintering described above may be omitted.

The method of manufacturing a superconducting wire of the present embodiment includes the step of drawing wire 1a formed by coating raw material powder 2a for a superconductor with a metal (Step S3), the step of the first rolling (Step S8) rolling multifilamentary wire 1c after the step of drawing (Step S3), and the step of the first sintering (Step S10) sintering multifilamentary wire 1 after the step of the first rolling (Step S8). The method further includes the step of holding clad wire 1b, multifilamentary wire 1c, or multifilamentary wire 1 under a reduced-pressure atmosphere in at least one of an interval between the step of drawing (Step S3) and the step of the first rolling (Step S8) and an interval between the step of the first rolling (Step S8) and the step of the first sintering (Step S10) (Step S4, Step S7, Step S9).

The method of manufacturing a superconducting wire of the present embodiment includes the step of drawing wire 1a formed by coating raw material powder 2a for a superconductor with a metal (Step S3), the step of the first rolling (Step S8) rolling multifilamentary wire 1c after the step of drawing (Step S3), the step of the first sintering (Step S10) sintering multifilamentary wire 1 after the step of the first rolling (Step S8), the step of the second rolling (Step S12) rolling multifilamentary wire 1 again after the step of the first sintering (Step S10), and the step of the second sintering (Step S14) sintering multifilamentary wire 1 again after the step of the second rolling (Step S12). The method further includes the step of holding clad wire 1b, multifilamentary wire 1c, or multifilamentary wire 1 under a reduced-pressure atmosphere in at least one of an interval between the step of drawing (Step S3) and the step of the first rolling (Step S8), an interval between the step of the first rolling (Step S8) and the step of the first sintering (Step S10), an interval between the step of the first sintering (Step S10) and the step of the second rolling (Step S12), and an interval between the step of the second rolling (Step S12) and the step of the second sintering (Step S14) (Step S4, Step S7, Step S9, Step S11, Step S13).

According to the manufacturing method of the present embodiment, intrusion of $CO_2$, $H_2O$ and $O_2$ in the air into raw material powder 2a can be suppressed. Further, since clad wire 1b, multifilamentary wire 1c, or multifilamentary wire 1 is held under the reduced-pressure atmosphere, residues contained within clad wire 1b, multifilamentary wire 1c, or multifilamentary wire 1 such as $CO_2$, $H_2O$, $O_2$ and the like are discharged through both end portions of clad wire 1b, multifilamentary wire 1c, or multifilamentary wire 1, or sheath part 3 coating the superconductor. As a result, a hetero phase is less likely to be generated during sintering and the wire has a uniform thickness, and thus a superconducting wire having high and uniform performance can be obtained.

In the method of manufacturing a superconducting wire of the present embodiment, the step of holding (Step S9) is performed in the interval between the step of the first rolling (Step S8) and the step of the first sintering (Step S10). Thereby, a superconducting wire having higher and more uniform performance can be obtained.

In the method of manufacturing a superconducting wire of the present embodiment, the reduced-pressure atmosphere has a pressure of not more than 0.01 MPa. Thereby, intrusion of $CO_2$, $H_2O$ and $O_2$ in the air into superconductor filament 2 can further be suppressed.

In the method of manufacturing a superconducting wire of the present embodiment, the step of holding (Step S4, Step S7, Step S9, Step S11, Step S13) is performed for not less than 72 hours. Thereby, the residues contained within clad wire 1b, multifilamentary wire 1c, or multifilamentary wire 1 are discharged sufficiently.

In the method of manufacturing a superconducting wire of the present embodiment, multifilamentary wire 1 is held at a temperature of not less than 80° C. in the step of holding (Step S4, Step S7, Step S9, Step S11, Step S13). This facilitates evaporation of the residues contained within clad wire 1b, multifilamentary wire 1c, or multifilamentary wire 1, and thus a superconducting wire having high and uniform performance can be obtained.

In the method of manufacturing a superconducting wire of the present embodiment, the step of holding (Step S4, Step S7, Step S9, Step S11, Step S13) is performed in an atmosphere of nitrogen gas, argon gas, or dry air.

This can prevent impurities such as $CO_2$, $H_2O$, $O_2$ and the like from intruding into the raw material powder during the step of holding.

Although the present embodiment has been described for the case where vacuum holding (Steps S4, 7, 9, 11, 13) is performed in each interval, the present invention is not limited to such a case, and it is sufficient to perform either one of the five steps of vacuum holding (Step S4, Step S7, Step S9, Step S11, Step S13).

Further, although the present embodiment has been described for the case where the vacuum holding (Step S11), the second rolling (Step S12), the vacuum holding (Step S13), and the second sintering (Step S14) are performed after the first sintering (Step S10), these steps may be omitted, and a superconducting wire may be completed after the first sintering (Step S10).

Furthermore, although explanation has been given in the present embodiment on the method of manufacturing a bismuth-type multifilamentary oxide superconducting wire having the Bi2223 phase, the present invention is also applicable to a method of manufacturing an oxide superconducting wire having composition other than bismuth-type, such as yttrium-type. In addition, the present invention is also applicable to a method of manufacturing a monofilamentary superconducting wire.

EXAMPLES

In the following, examples of the present invention will be described.

First Example

In the present example, an effect of the vacuum holding (Step S9) after the first rolling (Step S8) was examined. Specifically, raw material powder 2a having the Bi2223 phase was produced (Step S1), and thereafter raw material powder 2a was filled into pipe 3a (Step S2) to form wire 1a. Next, wire 1a was drawn to form clad wire 1b (Step S3), and without being subjected to the vacuum holding, a plurality of clad wire 1b were bundled and fit into pipe 3b (Step S5) to form multifilamentary wire 1c. Next, multifilamentary wire 1c was drawn (Step S6), and without performing the vacuum holding, the first rolling was performed on multifilamentary wire 1c (Step S8) to obtain tape-like multifilamentary wire 1. Next, multifilamentary wires 1c of samples 2 to 4 were held at room temperature for one month, under a pressure of an atmosphere holding multifilamentary wire 1 set at atmospheric pressure, 0.01 MPa, and 0.001 MPa, respectively (Step S9). Multifilamentary wire 1 of sample 1 was held at room temperature for one day, at atmospheric pressure. Next, the first sintering was performed on multifilamentary wire 1 (Step S10), and without performing the vacuum holding, the second rolling was performed (Step S12). Thereafter, without performing the vacuum holding, the second sintering is performed on multifilamentary wire 1 (Step S14) to obtain two pieces of superconducting wire 1 each having a length of 400 m. The obtained two pieces of superconducting wire 1 were named as a lot A and a lot B, respectively. Next, each of lot A and lot B was divided into five pieces to measure a critical current value (A) and a thickness (mm) of each piece of superconducting wire 1. Table 1 shows the results. In Table 1, sample 1 is the superconducting wire held at atmospheric pressure for one day, and sample 2 is the superconducting wire held at atmospheric pressure for one month. Sample 3 is the superconducting wire held for one month under the atmosphere of the reduced pressure of 0.01 MPa, and sample 4 is the superconducting wire held for one month under the atmosphere of the reduced pressure of 0.001 MPa.

TABLE 1

| Sample No. | | Critical Current Value (A) | Thickness of Superconducting Wire (mm) |
|---|---|---|---|
| 1 | Lot A | 80~90 | 0.25 ± 0.01 |
|   | Lot B | 80~90 | 0.25 ± 0.01 |
| 2 | Lot A | 60~70 | 0.27 ± 0.02 |
|   | Lot B | 60~70 | 0.27 ± 0.03 |
| 3 | Lot A | 80~90 | 0.24 ± 0.01 |
|   | Lot B | 80~90 | 0.24 ± 0.01 |
| 4 | Lot A | 80~90 | 0.24 ± 0.01 |
|   | Lot B | 80~90 | 0.24 ± 0.01 |

As shown in Table 1, as for sample 1, the critical current value was 80 to 90 A and the thickness was 0.25 mm±0.01 mm in both lot A and lot B. As for sample 2, the critical current value was 60 to 70 A in both lot A and lot B, and the thickness of lot A in sample 2 was 0.27 mm±0.02 mm, while the thickness of lot B in sample 2 was 0.27 mm±0.03 mm. As for sample 3, the critical current value was 80 to 90 A and the thickness was 0.24 mm±0.01 mm in both lot A and lot B. As for sample 4, the critical current value was 80 to 90 A and the thickness was 0.24 mm±0.01 mm in both lot A and lot B.

From the results obtained above, it has been found that, in any of samples 1 to 4, the critical current value in each lot has a variation of about 10 A. Consequently, it has been found that variations are less likely to occur in each performance of the obtained superconducting wire by holding the superconductor wire between the first rolling and the first sintering under a constant condition. Further, since the critical current values in samples 3 and 4 are higher than that in sample 2, it has been found that a high performance superconducting wire can be obtained by holding the wire between the first rolling and the first sintering under a reduced-pressure atmosphere. Furthermore, since samples 3 and 4 have smaller thicknesses than those in samples 1 and 2, and they also have smaller variations in the thicknesses, it has been found that, by holding the wire between the first rolling and the first sintering under the reduced-pressure atmosphere, $CO_2$, $H_2O$, $O_2$ and the like in the air are less likely to intrude into the wire, and the residues contained within the wire are removed.

Second Example

In the present example, an effect of a holding time period in the vacuum holding (Step S9) after the first rolling (Step S8) on the wire was examined. Specifically, superconducting wire 1 was obtained by a method almost identical to the method in the first example. Multifilamentary wire 1c of sample 5 was first subjected to the first rolling (Step S9), and thereafter it was held at room temperature for one day, at atmospheric pressure (Step S9). Multifilamentary wires 1c of samples 6 to 9 were first subjected to the first rolling (Step S8), and thereafter they were held at room temperature under an atmosphere of 0.01 MPa, for one day, three days, ten days, and one month, respectively (Step S9). Thicknesses (mm) of the respective samples of superconducting wire 1 were measured. Table 2 shows the results. In Table 2, sample 6 is the superconducting wire held under the atmosphere of 0.01 MPa for one day, sample 7 is the superconducting wire held under the atmosphere of 0.01 MPa for three days, sample 8 is the superconducting wire held under the atmosphere of 0.01 MPa for ten days, and sample 9 is the superconducting wire held under the atmosphere of 0.01 MPa for one month.

TABLE 2

| Sample No. | | Thickness of Superconducting Wire (mm) |
|---|---|---|
| 5 | Lot A | 0.25 ± 0.01 |
|   | Lot B | 0.25 ± 0.01 |
| 6 | Lot A | 0.25 ± 0.01 |
|   | Lot B | 0.25 ± 0.01 |
| 7 | Lot A | 0.24 ± 0.01 |
|   | Lot B | 0.24 ± 0.01 |
| 8 | Lot A | 0.24 ± 0.01 |
|   | Lot B | 0.24 ± 0.01 |
| 9 | Lot A | 0.24 ± 0.01 |
|   | Lot B | 0.24 ± 0.01 |

As shown in Table 2, as for sample 5, the thickness was 0.25 mm±0.01 mm in both lot A and lot B. As for sample 6, the thickness was 0.25 mm±0.01 mm in both lot A and lot B. As for sample 7, the thickness was 0.24 mm±0.01 mm in both lot A and lot B. As for sample 8, the thickness was 0.24 mm±0.01 mm in both lot A and lot B. As for sample 9, the thickness was 0.24 mm±0.01 mm in both lot A and lot B.

From the results obtained above, since samples 7 to 9 have thicknesses smaller than those in samples 5 and 6, it has been found that holding the wire between the first rolling and the first sintering under a reduced-pressure atmosphere for not less than three days (72 hours) allows the residues contained within the wire to be discharged sufficiently.

Third Example

In the present example, an effect of a holding temperature in the vacuum holding (Step S9) after the first rolling (Step S8) on the wire was examined. Specifically, superconducting wire 1 was obtained by a method almost identical to the method in the first example. Multifilamentary wires 1c of samples 10 to 13 were first subjected to the first rolling (Step S8), and thereafter they were held under an atmosphere of 0.01 MPa for seven days, at room temperature, 50° C., 80° C., and 300° C., respectively (Step S9). Critical current values (A) of the respective samples were measured. Table 3 shows the results. In Table 3, sample 10 is the superconducting wire held at room temperature, sample 11 is the superconducting wire held at 50° C., sample 12 is the superconducting wire held at 80° C., and sample 13 is the superconducting wire held at 300° C.

TABLE 3

| Sample No. | | Critical Current Value (A) |
|---|---|---|
| 10 | Lot A | 80~90 |
|    | Lot B | 80~90 |
| 11 | Lot A | 80~90 |
|    | Lot B | 80~90 |
| 12 | Lot A | 85~90 |
|    | Lot B | 85~90 |
| 13 | Lot A | 85~90 |
|    | Lot B | 85~90 |

As shown in Table 3, as for sample 10, the critical current value was 80 to 90 A in both lot A and lot B. As for sample 11, the critical current value was 80 to 90 A in both lot A and lot B. As for sample 12, the critical current value was 85 to 90 A in both lot A and lot B. As for sample 13, the critical current value was 85 to 90 A in both lot A and lot B.

From the results obtained above, since samples 12 and 13 have higher critical current values than those in samples 10 and 11, and they also have smaller variations in the critical current values, it has been found that a superconducting wire with high and uniform performance can be obtained by holding the wire between the first rolling and the first sintering under a reduced-pressure atmosphere at not less than 80° C.

It should be understood that the embodiment and the examples herein disclosed are by way of illustration in all respects and not to be taken by way of limitation. The scope of the present invention is defined not by the above description but by the appended claims, and is intended to include all the modifications within the meaning and the scope equivalent to those of the claims.

The invention claimed is:

1. A method of manufacturing a superconducting wire, comprising the steps of:
    drawing a wire formed by coating raw material powder for a superconductor with a metal,
    rolling said wire after said step of drawing,
    sintering said wire after said step of rolling, and
    holding said wire under a reduced-pressure atmosphere in at least one of an interval between said step of drawing and said step of rolling and an interval between said step of rolling and said step of sintering, wherein during the at least one interval the wire is held at a temperature greater than or equal to 80° C. and less than or equal to 300° C.;
    said reduced-pressure atmosphere having a pressure of not more than 0.01 MPa.

2. The method of manufacturing a superconducting wire according to claim 1, wherein said step of holding is performed for not less than 72 hours.

3. The method of manufacturing a superconducting wire according to claim 1, wherein said step of holding is performed in an atmosphere of nitrogen gas, argon gas, or dry air.

4. A method of manufacturing a superconducting wire, comprising the steps of:
    drawing a wire formed by coating raw material powder for a superconductor with a metal,
    rolling said wire n times, wherein n times includes a first time and where n is a finite integer greater than or equal to 2, k is a finite integer satisfying $n \geq k \geq 2$; and
    sintering said wire n times, wherein n times includes a first time;
    wherein the first rolling step is performed after said drawing step,
    the first sintering step is performed after said first rolling step,
    the $k^{th}$ rolling step in said step of rolling said wire n times is performed after the $(k-1)$-th sintering step in said step of sintering said wire n times,
    the $k^{th}$ sintering step in said step in sintering said wire n times is performed after the step of the $k^{th}$ rolling in said step of rolling said wire n times, and
    holding said wire under a reduced-pressure atmosphere in at least one of an interval between said drawing step and said rolling step, an interval between said first rolling step and said first sintering step, an interval between said $(k-1)^{th}$ sintering step and said $k^{th}$ rolling step, and an interval between said k-th rolling step and said $k^{th}$ sintering step.

5. The method of manufacturing a superconducting wire according to claim 4, wherein said step of holding is performed in the interval between said step of the first rolling and said step of the first sintering.

6. The method of manufacturing a superconducting wire according to claim 4, wherein said reduced-pressure atmosphere has a pressure of not more than 0.01 MPa.

7. The method of manufacturing a superconducting wire according to claim 4, wherein said step of holding is performed for not less than 72 hours.

8. The method of manufacturing a superconducting wire according to claim 4, wherein said wire is held at a temperature of not less than 80° C. in said step of holding.

9. The method of manufacturing a superconducting wire according to claim 4, wherein said step of holding is performed in an atmosphere of nitrogen gas, argon gas, or dry air.

* * * * *

UNITED STATES PATENT AND TRADEMARK OFFICE
CERTIFICATE OF CORRECTION

| | | |
|---|---|---|
| PATENT NO. | : 7,596,852 B2 | Page 1 of 1 |
| APPLICATION NO. | : 10/568537 | |
| DATED | : October 6, 2009 | |
| INVENTOR(S) | : Jun Fujikami et al. | |

It is certified that error appears in the above-identified patent and that said Letters Patent is hereby corrected as shown below:

ON THE TITLE PAGE, ITEM (56)

Please add the following references under (56) References Cited – U.S. Patent Documents:

5,639,714     06/1997     Hikata et al

6,276,048     08/2001     Hikata et al

Please add the following references under (56) References Cited – Foreign Patent Documents:

JP     03-138820     06/1991

JP     04-292812     10/1992

JP     2003-242847     08/2003

JP     2003-303519     10/2003

Signed and Sealed this

Twentieth Day of April, 2010

David J. Kappos
*Director of the United States Patent and Trademark Office*